United States Patent
Sakakura et al.

(10) Patent No.: US 9,362,251 B2
(45) Date of Patent: Jun. 7, 2016

(54) ANTIOXIDANT GAS BLOW-OFF UNIT

(71) Applicant: Shinkawa Ltd., Tokyo (JP)

(72) Inventors: Mitsuaki Sakakura, Tokyo (JP); Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/678,094

(22) Filed: Apr. 3, 2015

(65) Prior Publication Data

US 2015/0214180 A1    Jul. 30, 2015

Related U.S. Application Data

(63) Continuation of application No. PCT/JP2013/061155, filed on Apr. 15, 2013.

(30) Foreign Application Priority Data

Oct. 5, 2012    (JP) ................................. 2012-222970

(51) Int. Cl.
*B23K 37/00*    (2006.01)
*H01L 23/00*    (2006.01)
(Continued)

(52) U.S. Cl.
CPC .............. *H01L 24/742* (2013.01); *B23K 3/082* (2013.01); *B23K 20/007* (2013.01); *H01L 24/78* (2013.01); *H01L 24/85* (2013.01); *H01L 24/45* (2013.01); *H01L 2224/45144* (2013.01); *H01L 2224/45147* (2013.01); *H01L 2224/781* (2013.01); *H01L 2224/78253* (2013.01); *H01L 2224/78268* (2013.01); *H01L 2224/78269* (2013.01); *H01L 2224/78301* (2013.01); *H01L 2224/852* (2013.01); *H01L 2224/85045* (2013.01); *H01L 2224/85054* (2013.01);
(Continued)

(58) Field of Classification Search
None
See application file for complete search history.

(56) References Cited

U.S. PATENT DOCUMENTS

| 4,976,393 A | 12/1990 | Nakajima et al. |
| 4,998,002 A * | 3/1991 | Okikawa .............. B23K 20/007 |
| | | 219/56.22 |
| 6,180,891 B1 | 1/2001 | Murdeshwar |

(Continued)

FOREIGN PATENT DOCUMENTS

| JP | 59-72730 | 5/1984 |
| JP | 63-147338 | 6/1988 |

(Continued)

OTHER PUBLICATIONS

International Search Report dated Jul. 16, 2013, from corresponding International Application No. PCT/JP2013/061155.

(Continued)

*Primary Examiner* — Kiley Stoner
(74) *Attorney, Agent, or Firm* — Katten Muchin Rosenman LLP

(57) ABSTRACT

An antioxidant gas blow-off unit includes: a base portion configured as a hollow plate having an antioxidant gas flow passage formed therein; a hole that is provided in the base portion to allow a capillary to be inserted therein or removed therefrom and that communicates with the antioxidant gas flow passage; and a heater mounted on an outer surface of the base portion. The antioxidant gas flow passage includes a first flow passage provided in the vicinity of the outer surface of the base portion on which the heater is mounted. This antioxidant gas blow-off unit to be installed in a wire bonding apparatus heats free air balls effectively with a compact structure.

7 Claims, 8 Drawing Sheets

(51) Int. Cl.
*B23K 20/00* (2006.01)
*B23K 3/08* (2006.01)
(52) U.S. Cl.
CPC ............... *H01L 2224/85205* (2013.01); *H01L 2924/01029* (2013.01); *H01L 2924/181* (2013.01); *H01L 2924/365* (2013.01)

(56) References Cited

U.S. PATENT DOCUMENTS

| | | | |
|---|---|---|---|
| 6,234,376 B1 * | 5/2001 | Wicen .................. | H01L 24/85 219/56.22 |
| 7,614,538 B2 | 11/2009 | Gillotti et al. | |
| 7,628,307 B2 | 12/2009 | Wong et al. | |
| 7,938,308 B1 * | 5/2011 | Kim .................. | B23K 20/007 219/56.1 |
| 8,186,562 B1 | 5/2012 | Song et al. | |
| 8,313,015 B2 | 11/2012 | Gillotti et al. | |
| 9,044,821 B2 * | 6/2015 | Maeda .................. | H01L 24/78 |
| 2003/0019906 A1 | 1/2003 | Sakai et al. | |
| 2007/0251980 A1 | 11/2007 | Gillotti et al. | |
| 2008/0035709 A1 | 2/2008 | Nishiura et al. | |
| 2009/0134201 A1 | 5/2009 | Jindo et al. | |
| 2010/0078464 A1 | 4/2010 | Nishiura | |
| 2010/0230476 A1 | 9/2010 | Gillotti et al. | |
| 2011/0049219 A1 * | 3/2011 | Huang .................. | B23K 20/007 228/42 |
| 2011/0277861 A1 | 11/2011 | Liu | |
| 2014/0332583 A1 | 11/2014 | Maeda | |

FOREIGN PATENT DOCUMENTS

| | | | |
|---|---|---|---|
| JP | 63-164230 | 7/1988 | |
| JP | 63-266845 | 11/1988 | |
| JP | 03-253045 | 11/1991 | |
| JP | 2975207 B2 * | 11/1999 | ............ H01L 24/78 |
| JP | 2007-294975 | 11/2007 | |
| JP | 2008-130825 | 6/2008 | |
| JP | 2011-040635 | 2/2011 | |

OTHER PUBLICATIONS

Written Opinion of the International Searching Authority dated Jul. 16, 2013, from corresponding International Application No. PCT/JP2013/061155.
International Search Report dated Feb. 26, 2013, from International Application No. PCT/JP2012/081135.
Written Opinion of the International Searching Authority dated Feb. 26, 2013, from International Application No. PCT/JP2012/081135.

* cited by examiner

ANTIOXIDANT GAS BLOW-OFF UNIT

BACKGROUND OF THE INVENTION

1. Field of the Invention

The present invention relates to the structure of an antioxidant gas blow-off unit to be installed in a wire bonding apparatus.

2. Description of the Related Art

A large number of wire bonding apparatus employ ball bonding. In the ball bonding, a wire tail that extends from the tip of a capillary as a bonding tool is formed into a free air ball by a spark, and then the free air ball is bonded to a semiconductor element or an electrode of a substrate with the tip of the capillary.

Although gold wires have been conventionally used for wire bonding, copper wires are now increasingly used because of lower cost and superior electric properties. However, the copper wire is more susceptible to oxidation than the gold wire, and thus when the free air ball is formed from the copper wire by a spark, an oxide film might be formed on the surface of the ball. Such an oxide film weakens bonding between the free air ball and the electrode, leading to defective bonding. For this reason, a method for suppressing the oxidation of the surface of the ball is proposed which includes forming a free air ball under inert gas, such as nitrogen or argon gas, in bonding by use of a copper wire (see for example, Patent Document 1).

In contrast, when the surface temperature of the free air ball becomes low at the time of bonding, the bonding strength between the free air ball and electrode might be weakened. Furthermore, when the surface temperature of the free air ball becomes low at the time of forming the fee air ball, the resultant ball might be deformed (formed into a noncircular shape). For this reason, a method for ensuring the bonding strength is proposed which includes flowing heated deoxidation gas through surroundings of the free air ball before, throughout and after the formation of the free air ball, thereby keeping the temperature of the free air ball at high temperature (see for example, Patent Document 2). Moreover, another bonding method is proposed which includes suppressing oxidation of the surface of a free air ball by forming the free air ball with the heated inert gas flowing therethrough, while keeping the free air ball at high temperature (see for example, Patent Document 3).

However, like the related art described in Patent Document 2, 3, in the structure for ejecting the heated inert gas from a gas nozzle, it is necessary to increase the flow rate of inert gas in order to maintain an inert gas atmosphere. Therefore, a large-sized heater is also required to heat the inert gas. Potential problems with this case are that the bonding apparatus is enlarged and its slow operation inhibits high-speed bonding.

CITATION LIST

Patent Document

Patent Document 1: Japanese Unexamined Patent Application Publication No. 2007-294975

Patent Document 2: Japanese Unexamined Patent Application Publication No. 63(1988)-164230

Patent Document 3: Japanese Unexamined Patent Application Publication No. 63(1988)-266845

SUMMARY OF THE INVENTION

Problem to be Solved by the Invention

Accordingly, it is an object of the present invention to provide an antioxidant gas blow-off unit that can effectively heat free air balls with a compact structure.

Means for Solving Problem

An antioxidant gas blow-off unit according to the present invention includes a base portion configured as a hollow plate having an antioxidant gas flow passage formed therein, a hole provided in the base portion to allow a capillary to be inserted thereinto or removed therefrom and communicating with the antioxidant gas flow passage, and a heater mounted on an outer surface of the base portion. Further, the antioxidant gas flow passage includes a first flow passage provided in the vicinity of the outer surface of the base portion with the heater mounted thereon.

In the antioxidant gas blow-off unit according to the present invention, preferably, the antioxidant gas flow passage includes a second flow passage provided between the first flow passage and the hole and which is deeper than the first flow passage, and the first flow passage at least partially surrounds the second flow passage.

In the antioxidant gas blow-off unit according to the present invention, the second flow passage preferably includes a plurality of outlets for blowing an antioxidant gas toward a center of the hole, and a labyrinth that changes a flow direction of the antioxidant gas between the first flow passage and each of the outlets at least twice.

In the antioxidant gas blow-off unit according to the present invention, an electric flame off probe is preferably disposed in a through-hole provided in a side surface of the hole.

Effect of the Invention

Therefore, the present invention provides an advantageous effect of providing an antioxidant gas blow-off unit that can effectively heat free air balls with a compact structure.

DESCRIPTION OF THE PREFERRED EMBODIMENTS

Figure 1:
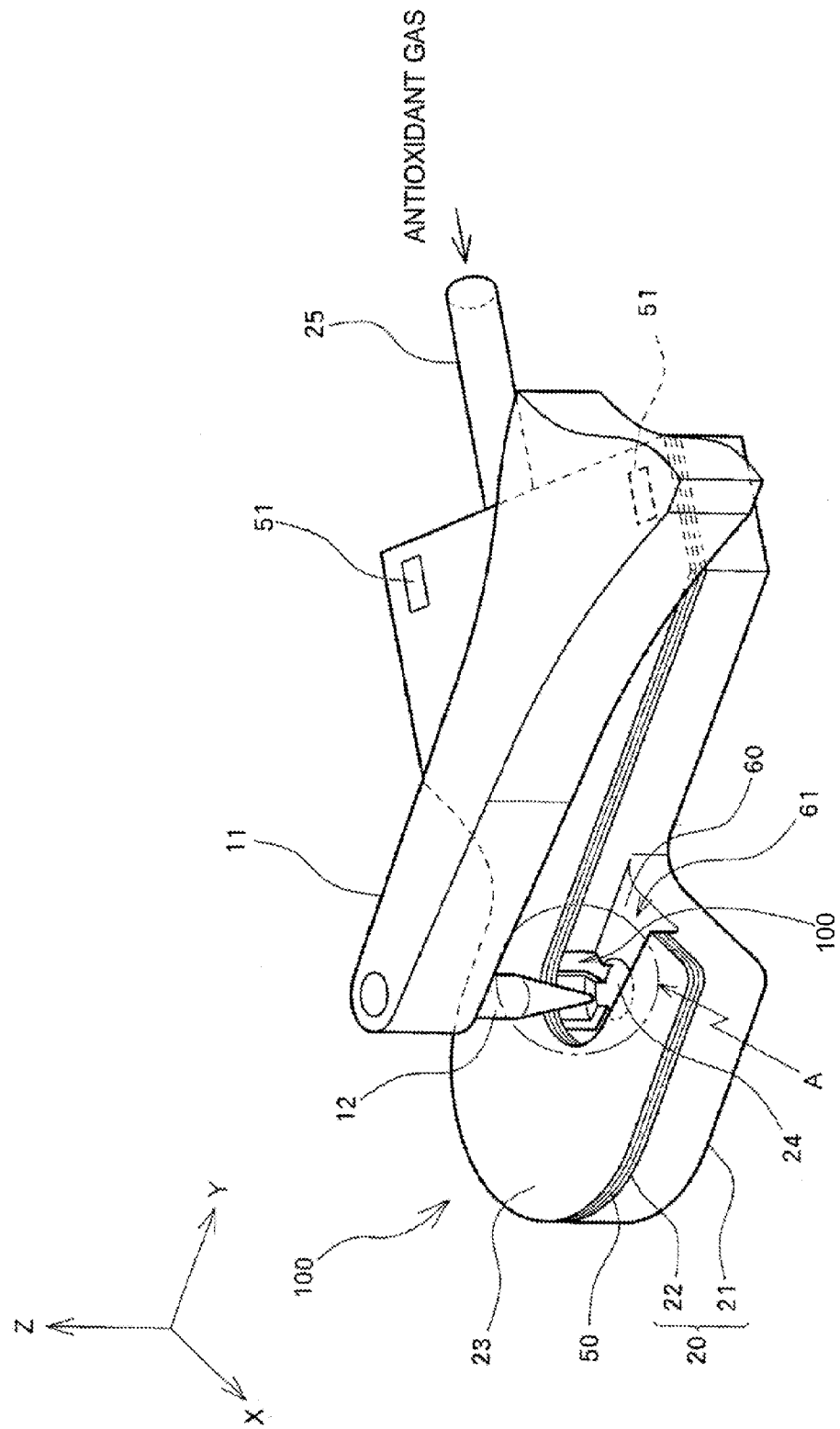
FIG. 1 shows a perspective view of a wire bonding apparatus in which an antioxidant gas blow-off unit according to an embodiment of the present invention is installed.

Exemplary embodiments of the present invention will be described below with reference to the accompanying drawings. As shown in FIG. 1, an antioxidant gas blow-off unit 100 according to an embodiment includes a plate-shaped hollow base portion 20 having an antioxidant gas flow passage 100 formed therein, a hole 24 provided in the base portion 20 so as to allow a capillary 12 to be inserted thereinto or removed therefrom and communicating with the antioxidant gas flow passage 100 and a heater 50 mounted on an outer surface of the base portion 20.

As shown in FIG. 1, the base portion 20 includes a main body 21 having on its surface a groove (to be described later) forming the antioxidant gas flow passage 100 and a thin flat-plate-shaped lid 22 mounted on the main body 21 and configured to close an opened end of the groove formed in the main body 21 to form the antioxidant gas flow passage 100 together with the groove. Thus, the (upper) surface of the lid 22 opposite to the main body 21 forms the outer surface of the base portion 20. The film-shaped heater 50 that has substantially the same planar shape as the lid 22 is mounted on the upper surface of the lid 22, or the outer surface of the base portion 20. A cover plate 23 that has substantially the same planar shape as the lid 22 is mounted on the upper surface of the heater 50. Electrodes 51 of the heater 50 are exposed from the cover plate 23. An antioxidant gas supply pipe 25 to which an antioxidant gas is supplied is connected to the main body 21.

Figure 2:
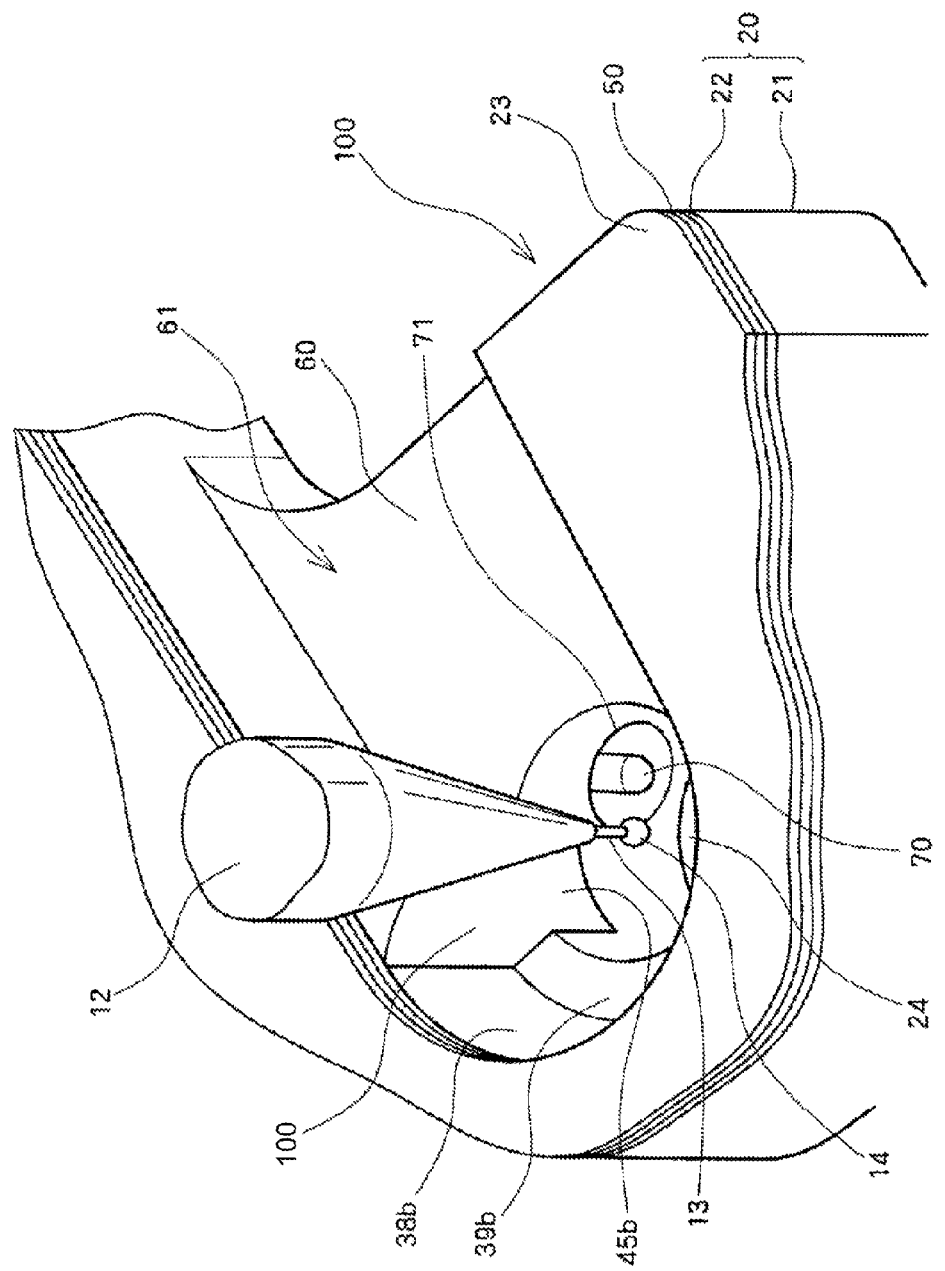
FIG. 2 shows an enlarged, perspective view of the part A in FIG. 1.

As shown in FIG. 2, a through-hole 71 is provided at the side surface of the hole 24 communicating with the antioxidant gas flow passage 100. An electric flame off probe 70 is disposed in the through-hole 71. The electric flame off probe 70 discharges electricity with a wire tail 13 extending from the tip of the capillary 12 to form the tip of the wire tail 13 into a free air ball 14.

When performing a bonding operation, the capillary 12 shown in FIG. 1 is moved vertically (along the direction Z) with an ultrasonic horn 11 attached to a bonding arm (not shown), and presses the free air ball 14 formed at the tip of the wire tail 13 against an electrode of a semiconductor die or substrate, thereby bonding the wire to the electrode. The antioxidant gas blow-off unit 100 is installed in a bonding head (not shown) provided with the ultrasonic horn 11, and is configured to move in directions X and Y together with both the ultrasonic horn 11 and the capillary 12. Examples of the antioxidant gas include an inert gas, such as a nitrogen or argon gas, and a mixture gas thereof containing a deoxidation gas, such as a hydrogen gas.

Figure 3:
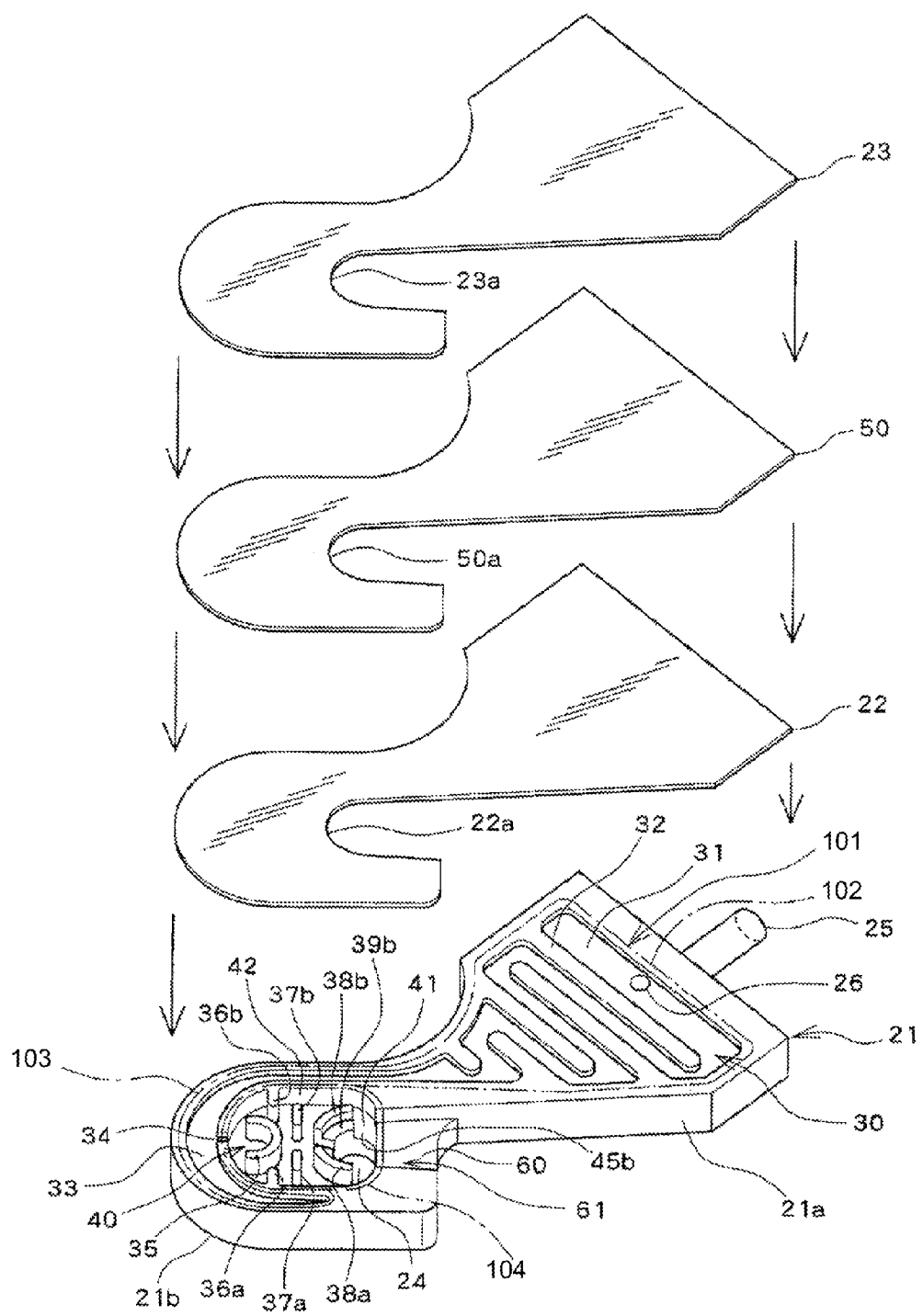
FIG. 3 shows a perspective view of a configuration of the antioxidant gas blow-off unit according to an embodiment of the present invention.
Figure 5:
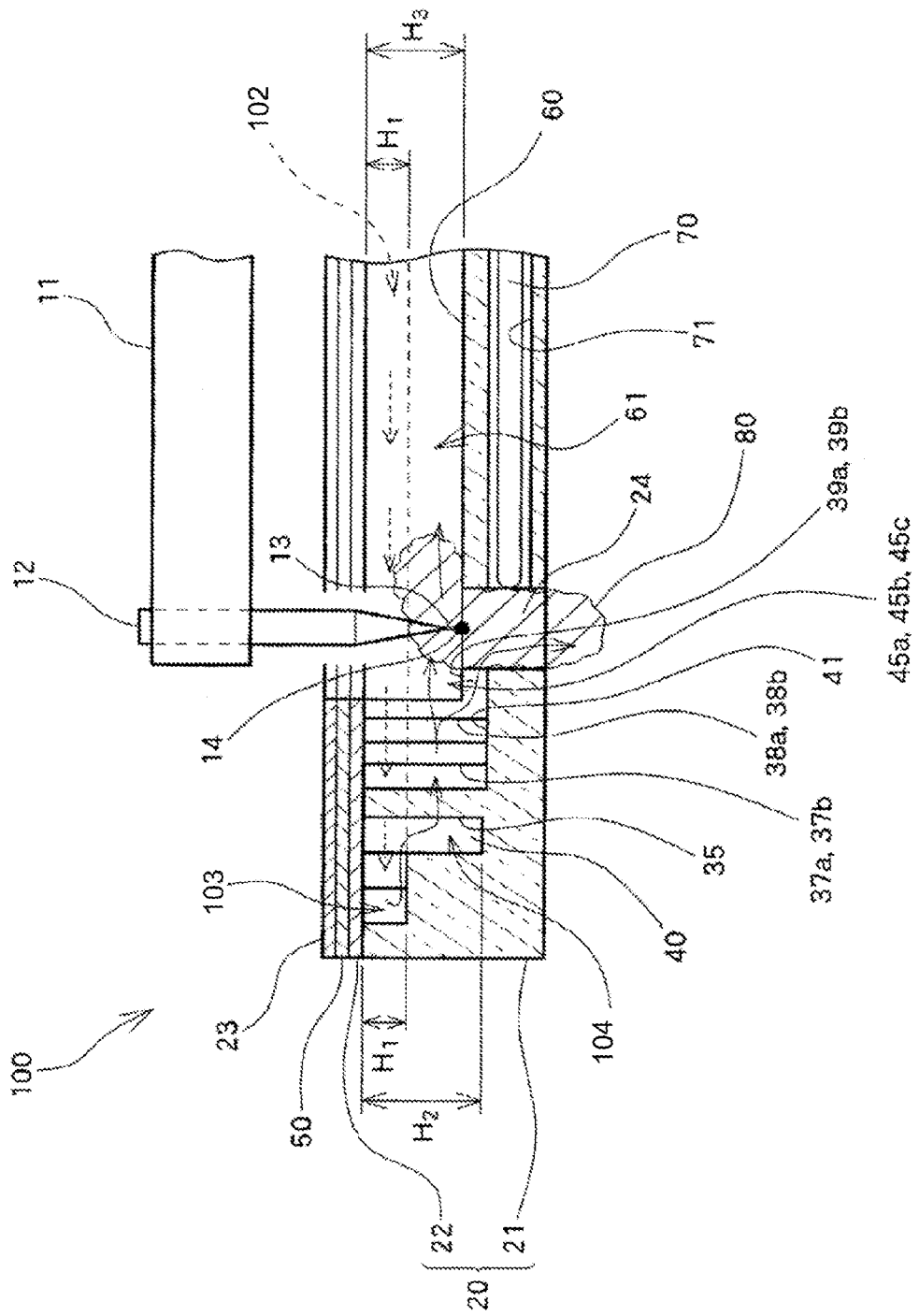
FIG. 5 shows an explanatory view schematically showing the cross-section of the antioxidant gas blow-off unit according to an embodiment of the present invention.

As shown in FIG. 3, the main body 21 includes a substantially trapezoidal first part 21a having its width decreased from a base part thereof with the antioxidant gas supply pipe 25 attached thereto toward the tip thereof, and a rectangular second part 21b having its rounded tip and provided with the hole 24 through which the capillary 12 passes. The surface of the first part 21a is provided with a shallow meandering groove 31, and band-shaped ridges 32 between the meandering parts of the groove 31. The groove 31 in the base part side of the first part 21a is provided with an antioxidant gas supply hole 26 that communicates with the antioxidant gas supply pipe 25. The circumferential surface of the second part 21b is provided with a groove 33 that includes a linear part connected to the groove 31, and a crescent part formed along a semicircular shape at the tip of the second part 21b. As shown in FIG. 5, the grooves 31 and 33 in this embodiment have the same depth $H_1$.

Figure 4:
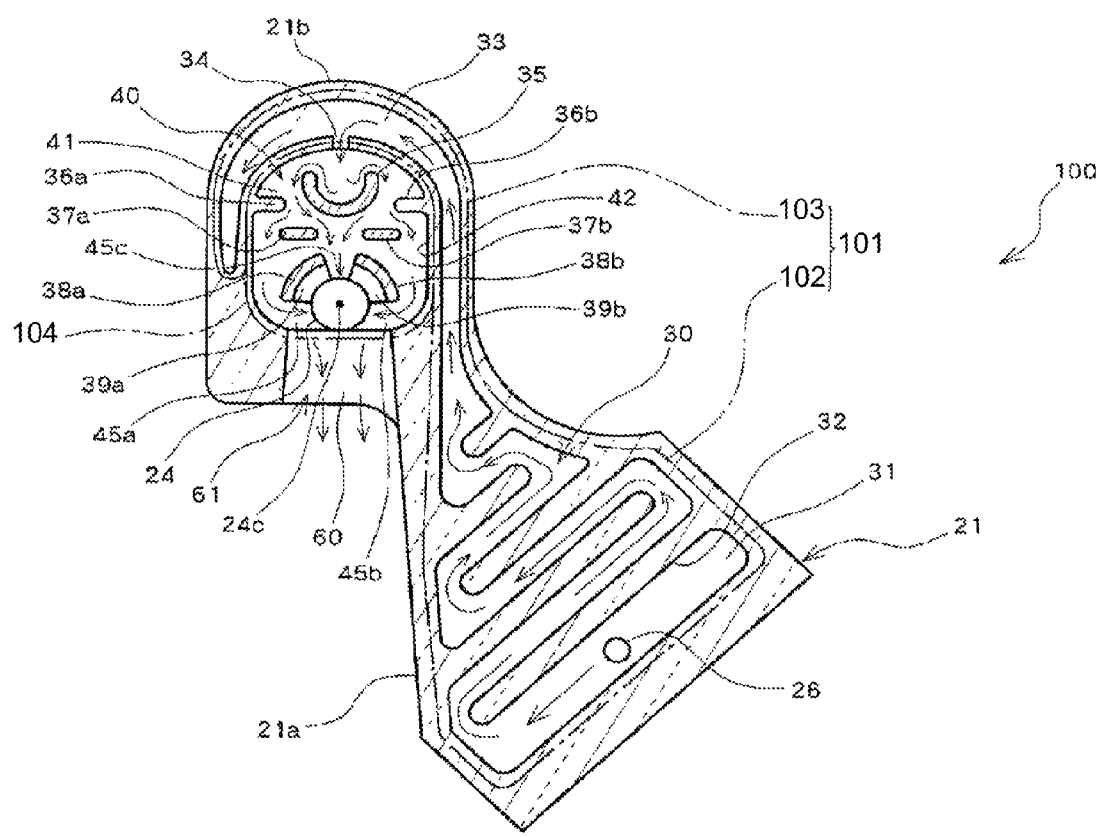
FIG. 4 shows an explanatory view of the antioxidant gas flow passage in the antioxidant gas blow-off unit according to an embodiment of the present invention.

A recess 40 is formed in the center of the second part 21b that is deeper than the grooves 31 and 33. The groove 33 and the recess 40 communicate with each other through a connection flow passage 34. As shown in FIG. 5, the recess 40 has a depth $H_2$. As shown in FIG. 4, a plurality of projections 35, 36a, 36b, 37a, 37b, 38a and 38b are provided within the recess 40. Specifically, as shown in FIGS. 3 and 4, the semi-cylindrical projection 35 projects from a bottom surface 41 of the recess 40, and is incurved toward the connection flow passage 34. The projections 36a and 36b are plate-shaped projections that project from left and right side surfaces 42 of the recess 40, respectively, toward the side surfaces of the projection 35. The projections 37a and 37b are plate-shaped projections that project from the bottom surface 41 of the recess 40 on the hole 24 side of each gap between the projection 35 and each of the projections 36a and 36b. The projections 38a and 38b are arc-shaped projections that project from the bottom surface 41 of the recess 40 and which are disposed spaced apart from each other along the periphery of the hole 24. The projections 38a and 38b are provided with stages 39a and 39b, respectively, on their side surfaces which face the hole 24, and the stages 39a and 39b are formed at a higher position than the bottom surface 41 of the recess 40.

A groove 60 is provided in the main body 21 at a location close to the hole 24 in the recess 40 that is shallower than the recess 40. The groove 60 has a depth $H_3$ from the surface of the main body 21 as shown in FIG. 5. Each of the stages 39a and 39b also has the depth $H_3$ from the surface of the main body 21 as shown in FIG. 5.

As shown in FIG. 5, all the upper surfaces of the projections 35, 37a, 37b, 38a and 38b are flush with the surface of the main body 21 on which the lid 22 is mounted, like the ridges 32 and the projections 36a and 36b shown in FIG. 4. As shown in FIG. 3, the lid 22 has a shape equivalent to that formed by removing parts corresponding to both the groove 60 and the area surrounding the hole 24 from the outline of the main body 21 so as to have a U-shape notch. Further, a U-shaped notch 22a of the lid 22 is slightly smaller in radius than the arc-shaped surface of each of the projections 38a and 38b on the hole 24 side. Therefore, as shown in FIG. 3, when the flat sheet lid 22 is mounted on the main body 21, the surface of the main body 21 surrounding the grooves 31 and 33 and the respective upper surfaces of the ridges 32 and projections 35, 36a, 36b, 37a, 37b, 38a and 38b make contact with the bottom surface of the lid 22. As a result, the lid 22, the grooves 31 and 33, and the ridges 32 configure a shallow first flow passage 101. The first flow passage 101 includes a meandering upstream flow passage 102 formed close to the surface of the first part 21a in the main body 21, and a crescent downstream flow passage 103 that continues to a linear passage formed close to the surface of the second part 21b in the main body 21. The lid 22, the recess 40, and the projections 35, 36a, 36b, 37a, 37b, 38a and 38b configure a second flow passage 104 that communicates with the hole 24. The first flow passage 101 and the second flow passage 104 communicate with each other through the connection flow passage 34. Accordingly, the antioxidant gas flow passage 100 is configured by the first flow passage 101 including the upstream flow passage 102 and the downstream flow passage 103, and the second flow passage 104 disposed between the first flow passage and the hole 24.

As shown in FIG. 3, the linear part of the downstream flow passage 103 in the first flow passage 101 is disposed parallel to the second flow passage 104, and the crescent part of the downstream flow passage 103 is disposed along the outer periphery of the second flow passage 104 and between the second flow passage 104 and the outer surface of the second part 21b. Accordingly, the downstream flow passage 103 surrounds the second flow passage 104 at the tip end of the second part 21b.

Both the groove 60 and the area surrounding the hole 24 which correspond to the U-shaped notch 22a of the lid 22 are not covered with the lid 22 to be left open. Thus, the hole 24 is visible from the surface of the lid 22. Furthermore, the groove 60 configures a groove-shaped flow passage 61 that is opened toward the lid 22, and creates a clearance for preventing the ultrasonic horn 11 from hitting the main body 21 when the ultrasonic horn 11 moves downward.

As shown in FIG. 3, the film-shaped heater 50 and the cover plate 23 also have substantially the same shape as the lid 22, and are provided with U-shaped notches 50a and 23a, respectively, that have substantially the same shape as the notch 22a of the lid 22. Accordingly, when the lid 22, the heater 50, and the cover plate 23 are stacked on the surface of the main body 21, the U-shaped notches 50a and 23a of the heater 50 and the cover plate 23, respectively, do not also cover the area surrounding the hole 24 and the groove 60. As a result, the capillary 12 can enter the hole 24 through the U-shaped notches 22a, 50a and 23a, as shown in FIG. 1. In this embodiment, each of the main body 21, the lid 22, and the cover plate 23 is made of ceramic. As shown in FIG. 3, the main body 21, the lid 22, the heater 50, and the cover plate 23 are stacked in that order, and are formed by sintering or assembled with glue.

As shown in FIGS. 3 and 4, the meandering upstream flow passage 102 configured with the lid 22, the groove 31 and the ridges 32 has a sectional passage area that decreases toward its downstream. The most downstream, linear part of the upstream flow passage 102 which extends from the first part 21a to the second part 21b has the smallest sectional passage area. The linear part of the upstream flow passage 102 is connected to the linear part of the downstream flow passage 103 provided in the second part 21b of the main body 21. The downstream flow passage 103 is configured with the lid 22, the groove 33, and the surface of the main body 21 around the groove 33, and includes the linear and crescent parts. The linear part has the smallest sectional passage area in the downstream flow passage 103. The crescent part of the downstream flow passage 103 as a sectional passage area that gradually increases toward the tip end of the second part 21b but gradually decreases away from the tip end of the second part 21b, and extends to the site of the second part 21b opposite to the first part 21a. The crescent part of the downstream flow passage 103 is smaller in sectional passage area than the meandering parts of the upstream flow passage 102.

As shown in FIG. 5, both the upstream flow passage 102 and the downstream flow passage 103 are formed shallowly in the vicinity of the surface of the main body 21, and the lid 22 is formed of a thin flat plate. In addition, as shown in FIG. 3, the heater 50 is mounted over the entire region of the lid 22 covering the upstream flow passage 102 and the downstream flow passage 103. The antioxidant gas can be effectively heated with the heater 50. As described above, since the linear part that connects the upstream flow passage 102 to the downstream flow passage 103 has the smallest sectional passage area, the antioxidant gas travels through the linear part at the fastest flow rate. Moreover, since the crescent part of the downstream flow passage 103 is slightly smaller in sectional passage area than the meandering parts of the upstream flow passage 102, the antioxidant gas travels through the crescent part at a slightly slower flow rate than the above linear part. The crescent part of the downstream flow passage 103 disposed in a region (on the downstream side) beyond the tip of the second part 21b has a closed end, so that the antioxidant gas stays within the crescent part.

As shown in FIG. 4, the antioxidant gas flows into the upstream flow passage 102 through the antioxidant gas supply hole 26 provided in the groove 31 in the first part 21a of the main body 21. Then, the antioxidant gas travels through the meandering parts of the shallow upstream flow passage 102 while changing its flow direction, as indicated by arrows in FIG. 4. In a region from the upstream flow passage 102 to the crescent part of the downstream flow passage 103, the groove 31 is formed shallowly, so that the antioxidant gas effectively absorbs heat from the heater. While the antioxidant gas is traveling in the long meandering parts, the temperature of the antioxidant gas is gradually increasing. Then, when the antioxidant gas flows into the linear part that connects the upstream flow passage 102 to the downstream flow passage 103, the temperature of the antioxidant gas further increases. Subsequently, when the antioxidant gas flows into the crescent part of the downstream flow passage 103 positioned ahead (upstream) of the tip of the second part 21b, the temperature of the antioxidant gas further gradually increases. To give an example of increasing the temperature of the antioxidant gas in this embodiment, assuming that the film-shaped heater 50 is 0.015 mm thick and the input electricity is 1 W, it is possible to increase the temperature of the antioxidant gas traveling at a flow rate of 0.3 liter/min from a normal temperature to about 130° C. At this time, the temperature of the heater 50 is about 150° C. The crescent part of the downstream flow passage 103 disposed in a region (on the downstream side) beyond the tip of the second part 21b has the closed end, so that the antioxidant gas with increased temperature stays within the crescent part.

The high-temperature antioxidant gas flows into the second flow passage 104 through the connection flow passage 34. As described above, the second flow passage 104 is configured with the lid 22, the recess 40 with the depth $H_2$, and the projections 35, 36a, 36b, 37a, 37b, 38a and 38b. The second flow passage 104 is accordingly much larger in sectional passage area than the first flow passage 101 configured with the lid 22 and the shallow grooves 31 and 33 with the depth $H_1$. Thus, the antioxidant gas travels in the second flow passage 104 at a much slower flow rate than the first flow passage 101. For this reason, the antioxidant gas is maintained at high temperature with the heater 50, although being not heated with the heater 50 to the extent that the temperature thereof further increases.

As described above, the linear part of the downstream flow passage 103 in the first flow passage 101 is disposed parallel to the second flow passage 104, and the crescent part of the downstream flow passage 103 is disposed along the outer periphery of the second flow passage 104 between the second flow passage 104 and the outer surface of the second part 21b. Thus, the second flow passage 104 is partly surrounded by the downstream side flow passage 103 where the high-temperature antioxidant gas flows or stays. This suppresses the antioxidant gas in the second flow passage 104 from being reduced in temperature, and maintains the antioxidant gas in the second flow passage 104 at high temperatures in conjunction with heating of the heater 50.

As shown in FIG. 4, the high-temperature antioxidant gas flowing into the second flow passage 104 has its flow direction changed by the projections 35, 36a, 36b, 37a, 37b, 38a and 38b. More specifically, the antioxidant gas flowing into the second flow passage 104 through the connection flow passage 34 has its flow direction changed by the projection 35 toward the side surface 42 of the recess 40. Then, the flow direction of the gas is sequentially changed by the projections 36a and 36b to the center of the recess 40, and then by the projections 37a and 37b to each of the left and right sides. Subsequently, the flow direction of the gas is changed by the projections 38a and 38b toward the center 24c of the hole 24. Finally, the antioxidant gas blows out toward the center 24c of the hole 24 from outlets 45a, 45b and 45c located between the projections 38a and 38b, and between each of the projections 38a and 38b and the side surface 42 of the recess 40. That is, the projections 35, 36a, 36b, 37a, 37b, 38a and 38b configure a labyrinth that changes the flow direction of the high-temperature antioxidant gas at least twice. Then, the high-temperature antioxidant gas uniformly blows out toward the center 24c of the hole 24 from the outlet 45a, 45b and 45c, which are provided between the projections 38a and 38b, and between each of the projections 38a and 38b and the side surface 42 of the recess 40. A part of the antioxidant gas blown out uniformly from the outlets 45a, 45b and 45c to the center 24c of the hole 24 flows downward from the lower surface of the main body 21 through the hole 24, as shown in FIG. 5. The remaining gas flows out horizontally through the groove-shaped flow passage 61 configured with the groove 60.

The second flow passage 104 vertically diffuses the high-temperature antioxidant gas flowing into the first flow passage 101 near the surface of the main body 21, in the height direction of the main body 21, with the antioxidant gas kept at high temperature, so that the high-temperature antioxidant gas can be blown out over a wide range in the height direction. Since the hole 24 is provided in the bottom surface 41 of the recess 40, the flow of the antioxidant gas, which is to be blown out from the outlets 45a, 45b and 45c, is not disturbed by external airflow. Moreover, the projections 38a and 38b form walls around the hole 24, and the stages 39a and 39b of the projections 38a and 38b extend so as to be flush with the bottom surface of the groove 60, as shown in FIG. 5. This structure can create a high-temperature and high-concentration region 80 filled with a high-temperature and high-concentration antioxidant gas, around the hole 24 as indicated by the cloud marks in FIG. 5. In this embodiment, even at a low flow rate of the antioxidant gas, such as 0.3 liters/min as mentioned above, it is possible to produce the high-temperature and high-concentration region 80 that contains the antioxidant gas at a temperature of about 130° C. in a concentration of about 100%.

As shown in FIG. 5, the center of the capillary 12 is aligned with the center 24c of the hole 24. Then, the height of the ultrasonic horn 11 is adjusted such that the wire tail 13 at the tip of the capillary 12 enters into the high-temperature and high-concentration region 80 filled with the antioxidant gas. After that, electric discharge is generated between the wire tail 13 and the electric flame off probe 70 disposed in the through-hole 71 on the side surface of the hole 24. In this way, the wire tail 13 is formed into the free air ball 14, thus free air ball 14 is formed in the high-temperature and high-concentration antioxidant gas. It is therefore possible to suppress the free air ball 14 from being deformed (formed into a noncircular shape) and its surface from being oxidized. In addition, since the electric discharge is generated in the inert gas atmosphere, it is further possible to suppress deterioration of bonding which would be caused by, for example, oxidation of the electric flame off probe 70.

The antioxidant gas having a high temperature of about 130° C. can be uniformly blown out to the formed free air balls 14, thereby enabling bonding of the free air balls 14 while effectively keeping the free air balls 14 at high temperature. This can perform the bonding with sufficient bonding strength. Maintaining the free air balls 14 at high temperatures in this manner provides the following merits: bonding can be performed with soft free air balls; and strain hardening of a metal material, such as copper, forming a wire can be suppressed. Specifically, by suppressing a rapid temperature drop of the free air ball, the generation of impurities in the free air ball can be reduced and the hardening of the free air ball can be mitigated. This can decrease a pressing force and heat given to a substrate when performing bonding, achieving damage-free bonding (that hardly causes damage to the substrate and the like). In this way, the bonding qualities are improved. Furthermore, when the temperature of the free air ball increases when performing bonding, metal particles diffuse more appropriately within the bond. This can reduce the application of ultrasonic vibrations, further improving the bonding qualities.

As described above, the antioxidant gas blow-off unit 100 in this embodiment effectively increases the temperature of the antioxidant gas by using the shallow first flow passage 101 close to the surface of the main body 21 on which the heater 50 is mounted. In turn, the antioxidant gas blow-off unit 100 vertically diffuses the antioxidant gas in the height direction by using the second flow passage 104 that is deeper than the first flow passage 101, and blows out the antioxidant gas uniformly from a region surrounding the hole 24 to the free air ball 14. In this way, the free air ball 14 can be effectively heated or kept at the constant temperature even by a small amount of antioxidant gas, which enables the bonding with the sufficient bonding strength.

Moreover, the effective heating and heat retention of the free air balls 14 using a small amount of antioxidant gas can result in downsizing of the antioxidant gas flow passage 100 and a compact overall configuration.

Further, the second flow passage 104 is partly surrounded by the downstream side flow passage 103 where the high-temperature antioxidant gas flows or stays. This arrangement can effectively maintain the antioxidant gas in the second flow passage 104 at high temperature, and thus can blow out the high-temperature antioxidant gas to the free air balls 14.

Although in the embodiment described above, the heater 50 has substantially the same film shape as the lid 22, the heater 50 does not necessarily have to have a film shape, provided that it has a small thickness. Furthermore, the heater 50 does not necessarily have to have substantially the same shape as the lid 22, provided that it can heat the antioxidant gas traveling in the shallow first flow passage 101. Alternatively, a plurality of heaters can be mounted separately from one another on the surface of the lid 22.

Figure 6:
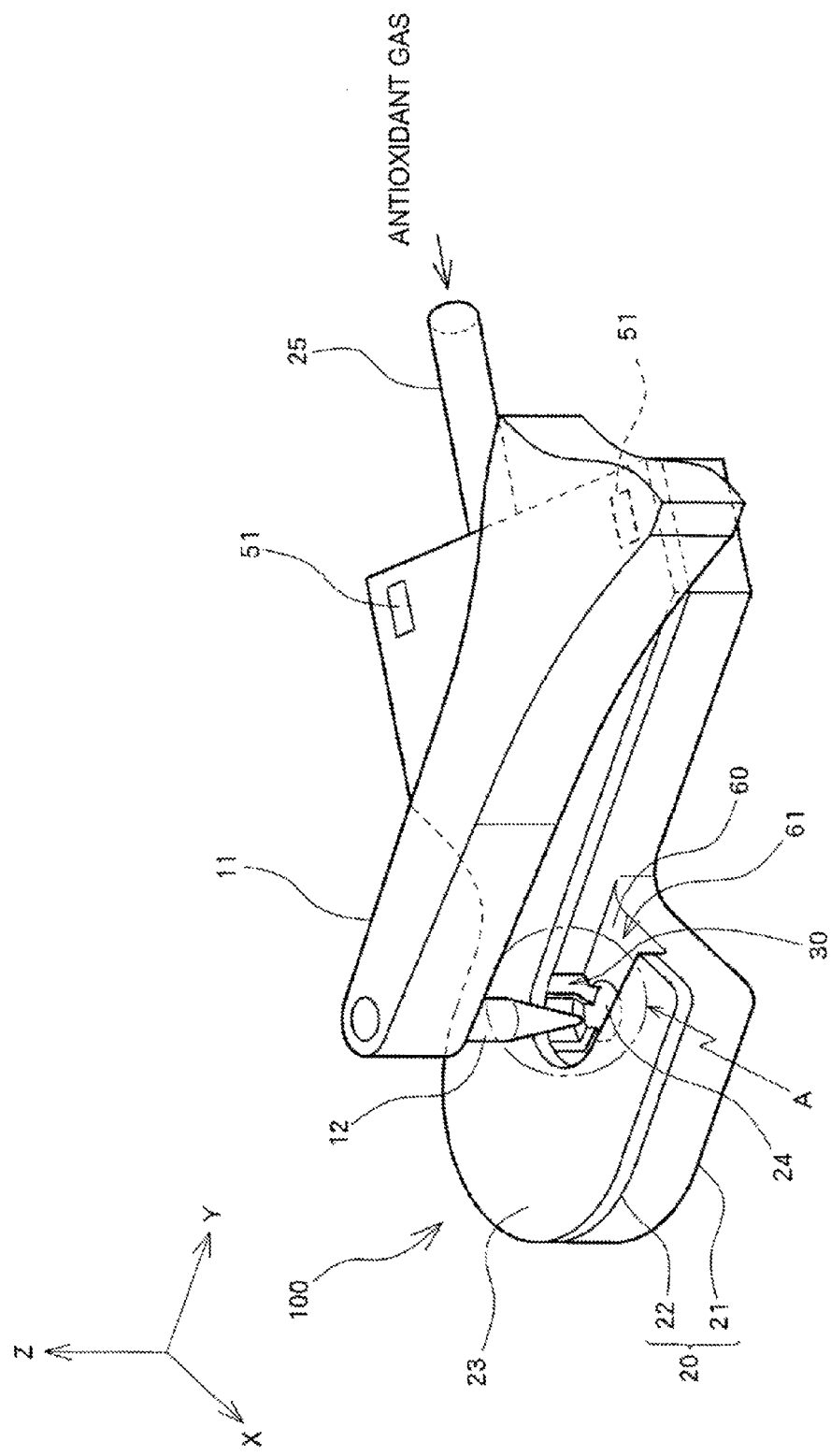
FIG. 6 shows a perspective view of a wire bonding apparatus in which an antioxidant gas blow-off unit according to another embodiment of the present invention is installed.
Figure 7:
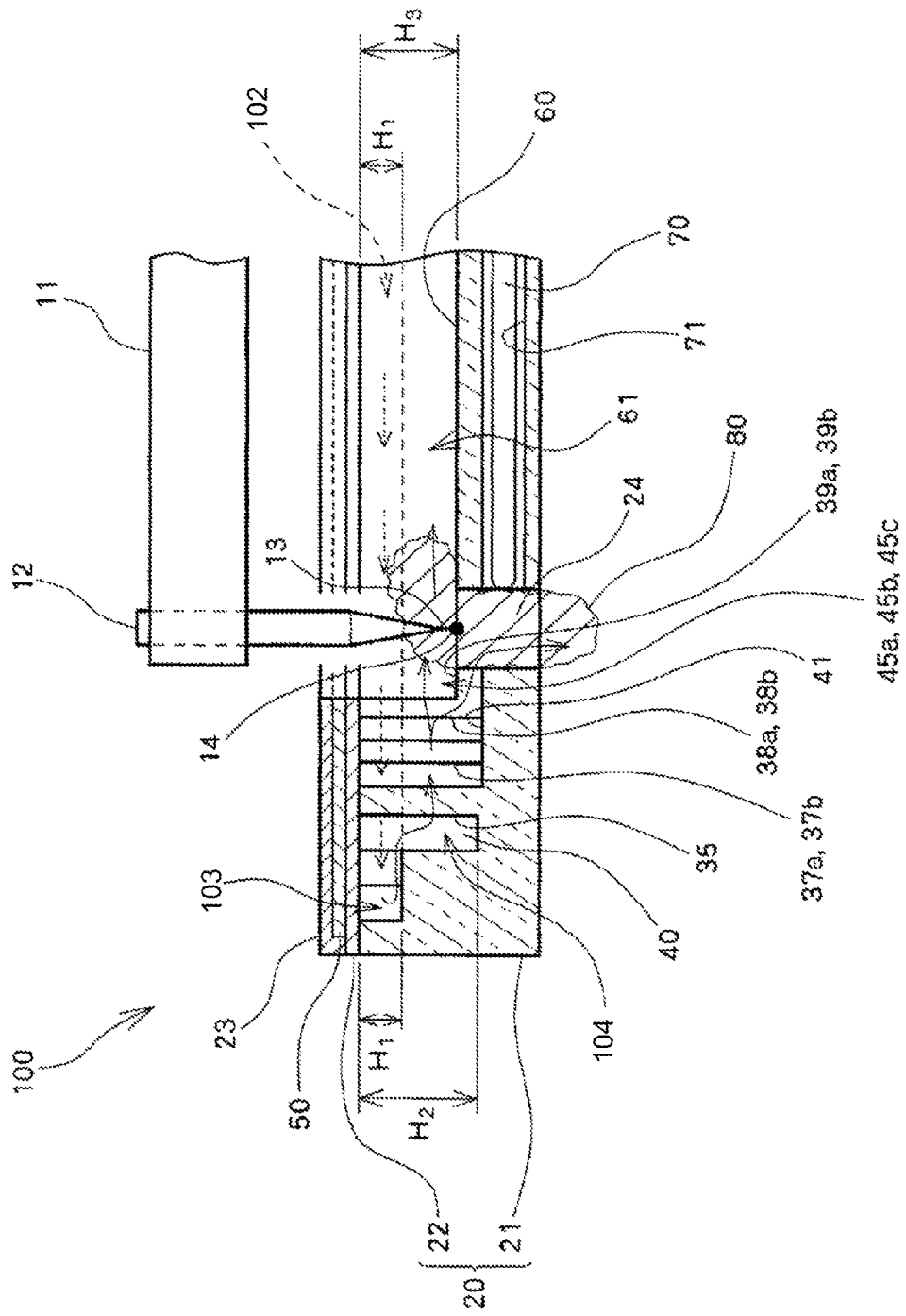
FIG. 7 shows an explanatory view schematically showing a cross-section of the antioxidant gas blow-off unit according to another embodiment of the present invention.

Next, another embodiment of the present invention will be described with reference to FIGS. 6 and 7. The same parts in the figures as those in the embodiment described with reference to FIGS. 1 to 5 are denoted by the same reference characters, and thus a description thereof will be omitted below. In this embodiment, as shown in FIG. 7, a heater 50 is slightly smaller in size than the outline of the lid 22 and a cover plate 23, and the cover plate 23 has a periphery thereof provided with a projection that covers the outer end of the heater 50. Therefore, as shown in FIG. 6, the end surface of the heater 50 is not exposed to the outside, so that the heater 50 is not visible from the outside.

Since the end surface of the heater 50 is not exposed to the outside, this embodiment can heat the antioxidant gas in the flow passage more effectively. When the film-shaped heater 50 is very thin, a configuration in which no projection is provided on the periphery of the cover plate 23 can be employed, as shown in FIG. 7.

Figure 8:
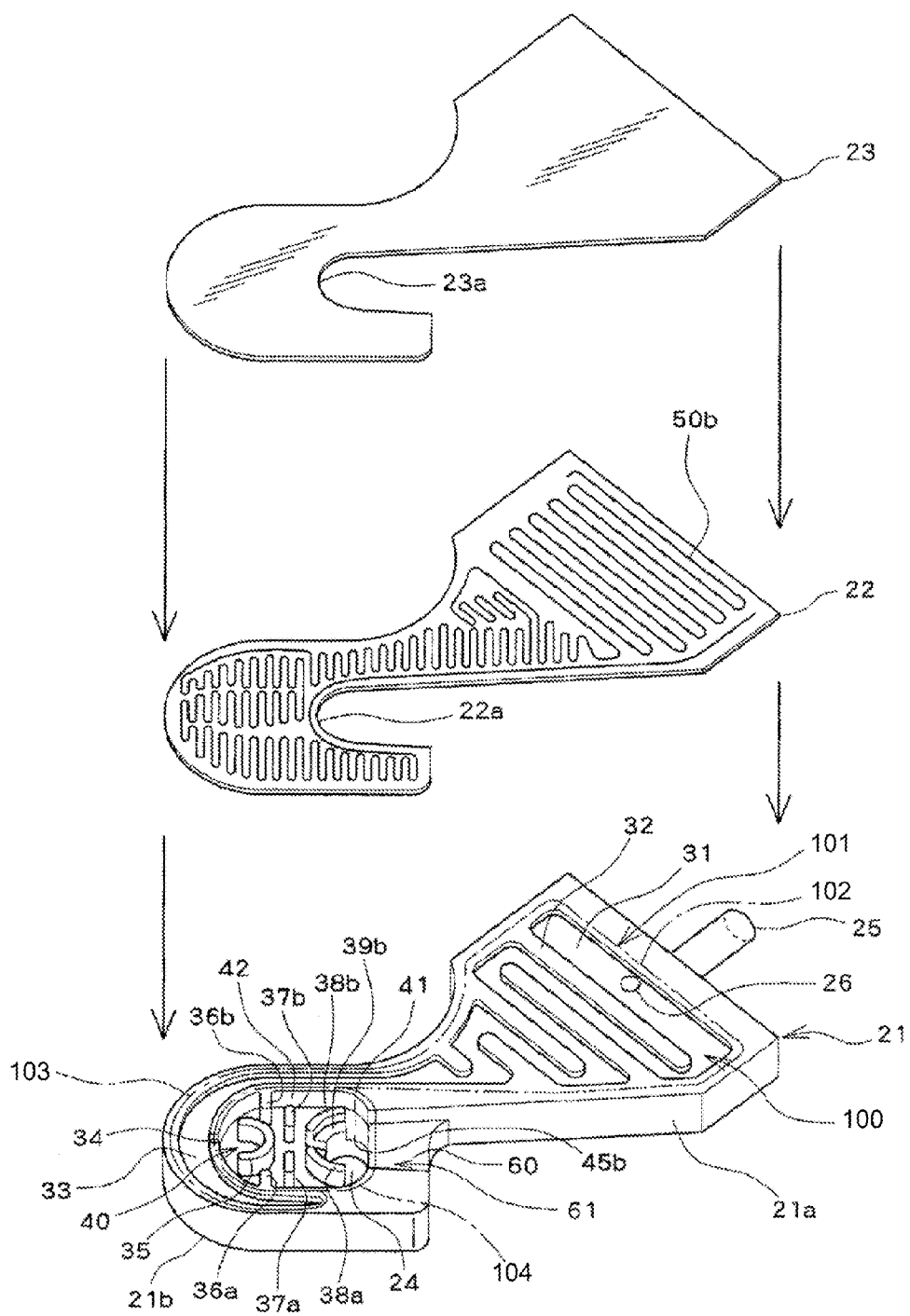
FIG. 8 shows a perspective view of a configuration of an antioxidant gas blow-off unit according to a further embodiment of the present invention.

Next, a further embodiment of the present invention will be described with reference to FIG. 8. The same parts in the figure as those in the embodiments described above are denoted by the same reference characters and thus a description thereof will be omitted below. In this embodiment, as shown in FIG. 8, a patterned heating resistor 50b is formed on a surface of a lid 22, instead of using the film-shaped heater 50 in the above-mentioned embodiments. This embodiment produces the same effects as the embodiments described above.

The present invention is not limited to the embodiments described above, and includes all possible modifications and variations that are within the technical scope or nature of the invention specified by the claims.

REFERENCE SIGNS LIST 11 ultrasonic horn
12 capillary
13 wire tail
14 free air ball
20 base portion
21 main body
21a first part
21b second part
22 lid
22a, 23a, 50a notch
23 cover plate
24 hole
24c center
25 antioxidant gas supply pipe
26 antioxidant gas supply hole
100 antioxidant gas flow passage
101 first flow passage
104 second flow passage
102 upstream flow passage
103 downstream flow passage
31, 33, 60 groove
32 ridges
34 connection flow passage
35, 36a, 36b, 37a, 37b, 38a, 38b projection
39a, 39b stage
40 recess
41 bottom surface
42 side surface
45a, 45b, 45c outlet
50 heater
50b heating resistor
51 electrodes
61 groove-shaped flow passage
70 electric flame off probe
71 through-hole
80 high-temperature and high-concentration region
100 antioxidant gas blow-off unit

What is claimed is:

1. An antioxidant gas blow-off unit comprising:
a base portion configured as a hollow plate having an antioxidant gas flow passage formed therein;
a hole provided in the base portion to allow a capillary to be inserted thereinto or removed therefrom, the hole communicating with the antioxidant gas flow passage; and
a heater mounted on an outer surface of the base portion;
wherein the antioxidant gas flow passage comprises a first flow passage proximal to the outer surface of the base portion on which the heater is mounted, the first flow passage being a groove;
wherein the first flow passage includes serpentine upstream flow passage.

2. An antioxidant gas blow-off unit comprising:
a base portion configured as a hollow plate having an antioxidant gas flow passage formed therein;
a hole provided in the base portion to allow a capillary to be inserted thereinto or removed therefrom, the hole communicating with the antioxidant gas flow passage; and
a heater mounted on an outer surface of the base portion;
wherein the antioxidant gas flow passage comprises a first flow passage proximal to the outer surface of the base portion on which the heater is mounted, the first flow passage being a groove;
wherein the antioxidant gas flow passage comprises a second flow passage provided between the first flow passage and the hole, the second flow passage being deeper than the first flow passage, and the first flow passage at least partially surrounding the second flow passage.

3. The antioxidant gas blow-off unit according to claim 2, wherein the second flow passage comprises
a plurality of outlets through which an antioxidant gas is blown out toward a center of the hole, and
a labyrinth changing a flow direction of the antioxidant gas between the first flow passage and each of the outlets at least twice.

4. An antioxidant gas blow-off unit comprising:
a base portion configured as a hollow plate having an antioxidant gas flow passage formed therein;
a hole provided in the base portion to allow a capillary to be inserted thereinto or removed therefrom, the hole communicating with the antioxidant gas flow passage; and
a heater mounted on an outer surface of the base portion;
wherein the antioxidant gas flow passage comprise a first flow passage proximal to the outer surface of the base portion on which the heater is mounted, the first flow passage being a groove;
wherein an electric flame off probe is disposed in a through-hole provided in a side surface of the hole.

5. The antioxidant gas blow-off unit according to claim 2, wherein an electric flame off probe is disposed in a through-hole provided in a side surface of the hole.

6. The antioxidant gas blow-off unit according to claim 3, wherein an electric flame off probe is disposed in a through-hole provided in a side surface of the hole.

7. The antioxidant gas blow-off unit according to claim 1, wherein the first flow passage comprises a downstream flow passage having crescent shape that connects to the upstream flow passage.

* * * * *